United States Patent
Chen

(10) Patent No.: US 10,182,511 B1
(45) Date of Patent: Jan. 15, 2019

(54) EXTENDABLE CABLE MANAGEMENT FRAME

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 0 days.

(21) Appl. No.: 15/802,858

(22) Filed: Nov. 3, 2017

(51) Int. Cl.
| H05K 7/00 | (2006.01) |
| H05K 7/14 | (2006.01) |
| H02G 3/04 | (2006.01) |
| H05K 7/18 | (2006.01) |
| H02G 3/32 | (2006.01) |
| H02G 11/00 | (2006.01) |

(52) U.S. Cl.
CPC ......... *H05K 7/1491* (2013.01); *H02G 3/0456* (2013.01); *H02G 3/32* (2013.01); *H05K 7/1489* (2013.01); *H05K 7/18* (2013.01); *H02G 11/006* (2013.01)

(58) Field of Classification Search
None
See application file for complete search history.

(56) References Cited

U.S. PATENT DOCUMENTS

| 8,387,933 | B2 * | 3/2013 | Yu | H05K 7/1491 211/26 |
| 2005/0145582 | A1 * | 7/2005 | Dubon | H02G 3/128 211/26 |
| 2006/0081735 | A1 * | 4/2006 | Chen | F16L 3/01 248/68.1 |
| 2006/0113433 | A1 * | 6/2006 | Chen | H05K 7/1491 248/70 |
| 2009/0014601 | A1 * | 1/2009 | Chen | H02G 3/0456 248/70 |
| 2010/0193646 | A1 * | 8/2010 | Chen | H02G 3/0456 248/70 |

FOREIGN PATENT DOCUMENTS

TW    I544861 B    8/2016

* cited by examiner

Primary Examiner — Courtney Smith
Assistant Examiner — Rashen E Morrison
(74) Attorney, Agent, or Firm — Rosenberg, Klein & Lee

(57) ABSTRACT

An extendable cable management frame includes a connecting frame, a pivot seat and two cable management frames. Both ends of the connecting frame are connected to and moved with middle rails on both sides, and the pivot seat is movably installed to the center of the connecting frame, and the connecting frame has at least one arc limit hole, and the pivot seat has a limit portion for limiting the range of rotating the pivot seat, and outer ends of the two cable management frames are connected to an end of one of the outer rails and the inner rail, and inner ends of the two cable management frames are connected to the pivot seat, and cables of a computer host are passed and accommodated in the two cable management frames.

7 Claims, 4 Drawing Sheets

EXTENDABLE CABLE MANAGEMENT FRAME

FIELD OF INVENTION

The present invention relates to the technical field of servo computer cabinets, in particular to an extendable cable management frame installed between a slide rail and a servo computer cabinet, and the extendable cable management frame has a simplified structure to reduce the manufacturing cost and improve the level of protection of a cable when the cable is pulled.

BACKGROUND OF INVENTION

1. Description of the Related Art

In general, an industrial servo computer cabinet has a plurality of equidistant accommodating spaces formed therein for placing a plurality of servo computer hosts, and various connecting cables exist between the servo computer cabinet and the servo computer hosts for transmitting signals and electric power. Such design is intended for facilitating users to remove the servo computer hosts for maintenance, repair or replacement. To manage the connecting cables, an appropriate cable management frame is installed between the servo computer cabinet and each servo computer host for storing the connecting cables to prevent the connecting cables from being tangled or becoming messy or making the maintenance or repair difficult.

A cable management frame or cable management device usually provides a solution for storing the servo computer hosts into the servo computer cabinet. When the cables are connected to the servo computer host, the cables extended to the rear will be passed and accommodated into the cable management frame or cable management device, before an operator can pull the servo computer host or store the servo computer cabinet conveniently without tangling or damaging the cables during the process. Therefore, the cable management frame is used very often, wherein a first cable frame and a second cable frame are pivotally coupled with each other by a pivot member, and the moving ends of the first cable frame and the second cable frame are fixed by positioning members such as screws and connected to one of the servo computer hosts and the servo computer cabinet, so that when the servo computer host is pulled outwardly, the cable management frame is changed from a bent (folded) mode into a stretched (unfolded) mode, the cables fixed to the first cable frame and the second cable frame can maintain the original folded mode after the moving process without being tangled.

However, most of cable management frames come with a two-stage or three-stage design, because the three-stage cable management frame has a limitation on the length. The design with a too-large length may provide insufficient support force and cause the frame to be drooping, or even rub the casing of the servo computer host. Therefore, a connecting frame coupled between two slide rails serves as a relay position, and two sides of the connecting frame have a cable management frame. When the servo computer host is pulled, the connecting frame will slide outward synchronously and drive the two cable management frames to extend and unfold. The design of such cable management device has been disclosed in R.O.C. Pat. No. I544861 entitled "Improved structure of cable management device", and the cable management device comprises a slide rail and a cable management frame coupled to the slide rail, and the cable management frame has a first support member and a second support member which are formed by bending a cable, and the first support member has a first pivot portion pivotally coupled to a first fixing member, and both ends of the first pivot portion have a first support portion extended n the same direction, and an end of the first support portion has a first connecting member inserted therein, and the second support member has a second pivot portion pivotally coupled to a second fixing member, and both ends of the second pivot portion have a second support portion extended in the same direction, and an end of the second support portion has a second connecting member inserted therein, and hollow portions disposed between the two first support portion of the first support member and between the two second support portions of the second support member are provided for reducing the area covered by the rear side of an electronic product, so as to maintain a good heat dissipation effect of the electronic product.

However, present common cables are usually fiber optic cables used for transmitting network signals. Although the fiber optic cable has a moderate bending effect, it is incompatible with the cable management device of the aforementioned patent, since excessive bending may crack or break the fiber optic cable, particularly at the position where the two cable management frames are pivotally coupled to the connecting frame, and such design is one with non-movable position. When the cable management frames on both sides are extended outwardly and unfolded, the cable between the two pivot portions may be bent excessively to crack or break the fiber optic cable. Obviously, the prior art requires improvements.

2. Summary of the Invention

In view of the aforementioned drawbacks, the present invention overcomes the drawbacks by providing an extendable cable management frame and using the special design of the pivot seat capable of rotating with the movement of the cable management frame, controlling the range of the rotation angle, and ensuring the cable not to be bent or broken when the cable is moving, and the simplified structure can reduce the manufacturing cost and protect the cable more effectively. In addition, an elastic member with a restoring force is installed, so that the pivot seat and the connecting frame can maintain their original position and resume their positions after use to improve the convenience of operation significantly.

To achieve the aforementioned and other objectives, the present invention provides an extendable cable management frame installed in a servo computer cabinet, for connecting a computer host between a pair of slide rails, and the slide rail having two opposite outer rails, and the interior of each outer rail sequentially having a middle rail and an inner rail, such that the inner rail and the middle rail are extended in the same direction and folded into the outer rail, and the cable management frame comprising: a connecting frame, with both ends coupled to and moved with the middle rails disposed on both sides respectively, and having a first pivot portion disposed at the center of the connecting frame, and the center of the first pivot portion having at least one arc limit hole; a pivot seat, comprising: a second pivot portion disposed at the center of the pivot seat and configured to be corresponsive to the first pivot portion, so that the pivot seat may be rotated with respect to the connecting frame; a limit portion disposed around the periphery of the second pivot portion and configured to be corresponsive to the arc limit hole; and a first connecting portion disposed separately and symmetrically on both sides of the top of the pivot seat; and two cable management frames, each being formed by two sectional arms, a connecting plate and a plurality of cable management boxes, and the connecting plate being coupled between the two sectional arms and serving as a fulcrum when the two cable management frames are folded, and an end portion of the arm disposed on the outer side of the two cable management frames being coupled to an end of one of the outer rails and the inner rail, and the end portion of the arm disposed on the inner side of the two cable management frames having a second connecting portion coupled to the two first connecting portions; when the computer host is pulled outwardly, the two cable management frames drive the pivot seat to rotate in a direction along the arc limit hole, so that the two cable management frames are unfolded in two opposite extending directions.

In a preferred embodiment, each arm has a slide groove formed along the extending direction, and each cable management box has a buckle portion disposed on the backside of the cable management box and movably installed to the arm, so that the cable management box can be limited to slide on the arm, and each cable management box includes a main body and a cover, and the main body has a cross-section substantially an U-shaped structure, and two opening end portions of the main body opening are a third pivot portion and a latch portion respectively, and the cover has a fourth pivot portion configured to be corresponsive to the third pivot portion and provided for pivotally coupling the cover to the main body to seal the opening. To facilitate the operation and use, the cover has at least one locking bump disposed at an edge of the cover and opposite to the arm, and the locking bump and the arm provide a latching and locking effect by mutual interference. In actual testing, the cover of the invention should have at least one locking bump installed at a 0-degree position corresponding to a position when the cover is covered, and the other locking bump is disposed at a 90-degree position corresponding to a position when the cover is opened, so that when the cover is covered or opened, the cable management box is locked at the position opposite to the arm. Such arrangement can facilitate the adjustment of different operations.

In addition, the connecting plate is in a shape substantially similar to the arc shape of the outer contour of a light bulb, and the connecting plate has a slide groove for installing the at least one cable management box and passing and accommodating the cables, so that the cables can be bent according to the shape of the connecting plate, and the curvature is large enough to prevent excessive bending of the cable or damaging the cable.

Since the pivot seat has a rotation, the curvature of the arc limit hole should be corresponsive to the rotation angle of the pivot seat and the rotation angle should not be greater than 90 degrees in order to prevent the arms from being pulled in the opposite direction by a too-large rotation angle or failing to be withdrawn. It is noteworthy that a predetermined distance is maintained between the bottom of the pivot seat and the connecting frame, so that a friction effect can be produced between the bottom of the pivot seat and a surface of the connecting frame to provide the positioning effect for folding and unfolding.

In addition, the extendable cable management frame of the present invention further comprises an elastic member, installed to the pivot seat and between the connecting frames, so that the pivot seat maintains its original position when the connecting frame is not rotated. The elastic member is a coil spring capable of automatically resuming the pivot seat to its original position when the pivot seat is pushed inwardly.

DESCRIPTION OF THE PREFERRED EMBODIMENTS

To make it easier for our examiner to understand the objective of the invention, its structure, innovative features, and performance, we use a preferred embodiment together with the attached drawings for the detailed description of the invention.

Figure 1:
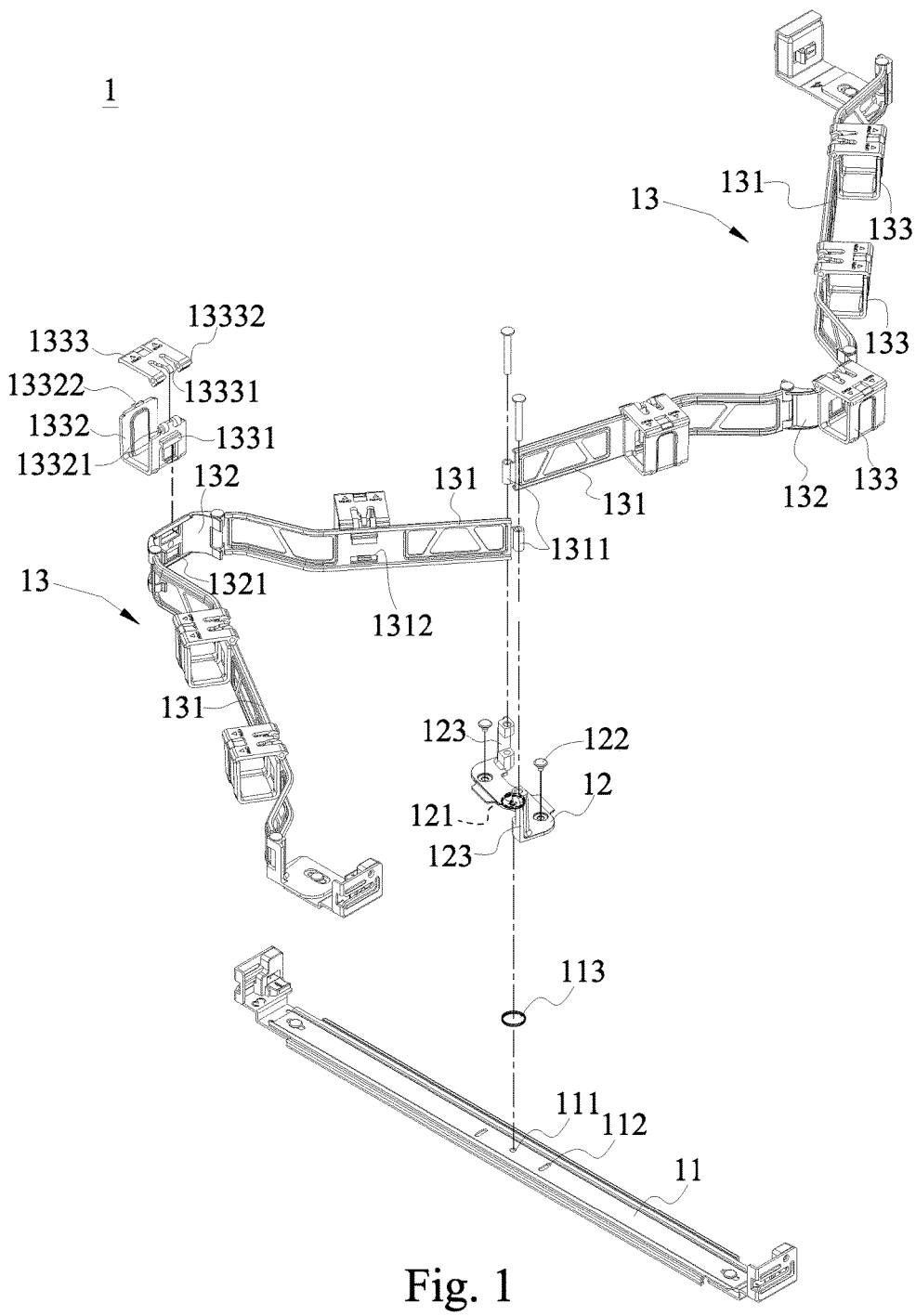
FIG. 1 is an exploded view of an extendable cable management frame in accordance with a preferred embodiment of the present invention.
Figure 2:
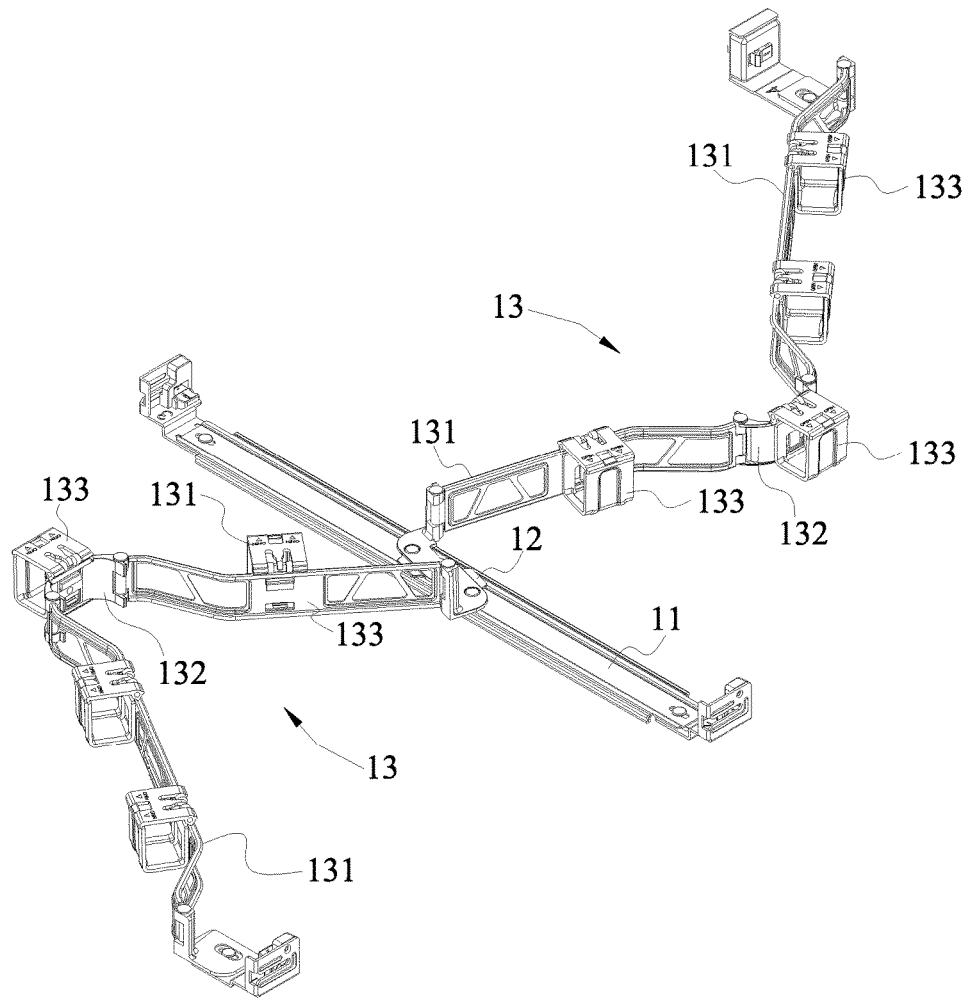
FIG. 2 is a perspective view of an extendable cable management frame in accordance with a preferred embodiment of the present invention.
Figure 3:
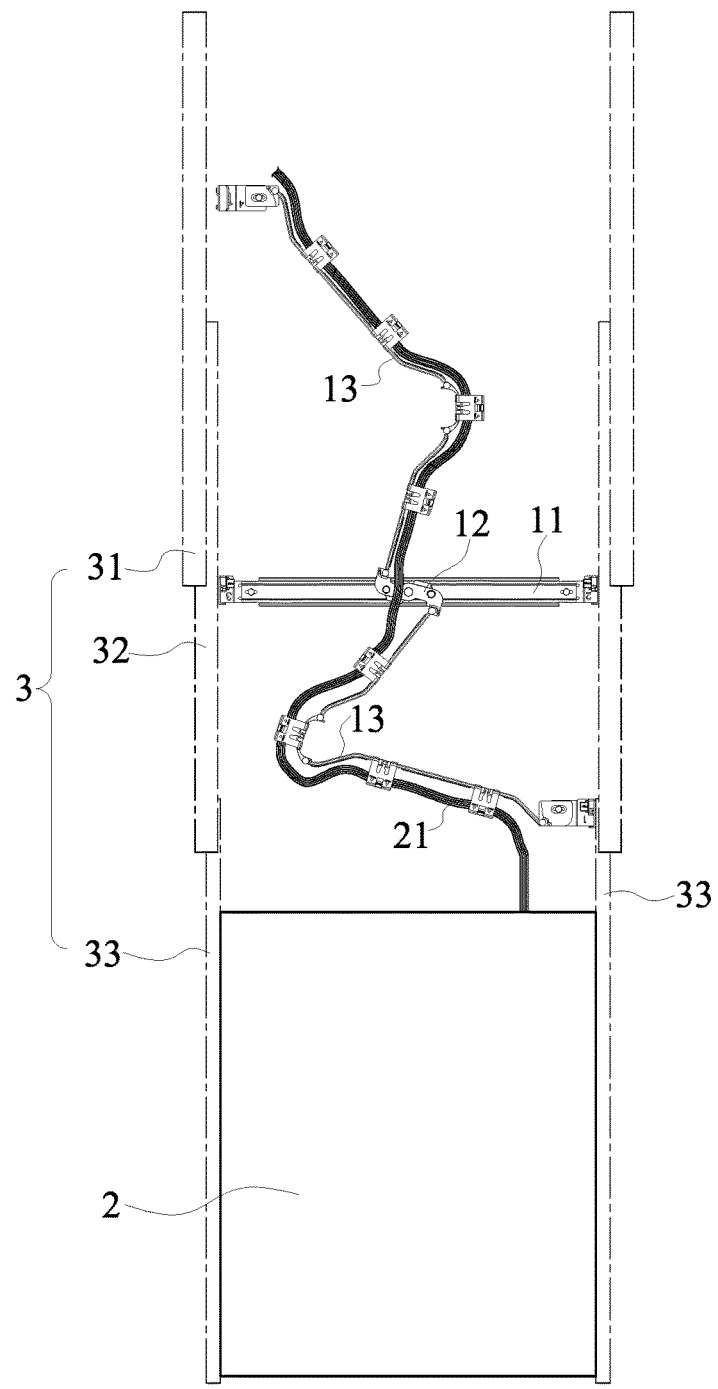
FIG. 3 is a schematic view of the operation of an extendable cable management frame being unfolded in accordance with a preferred embodiment of the present invention.
Figure 4:
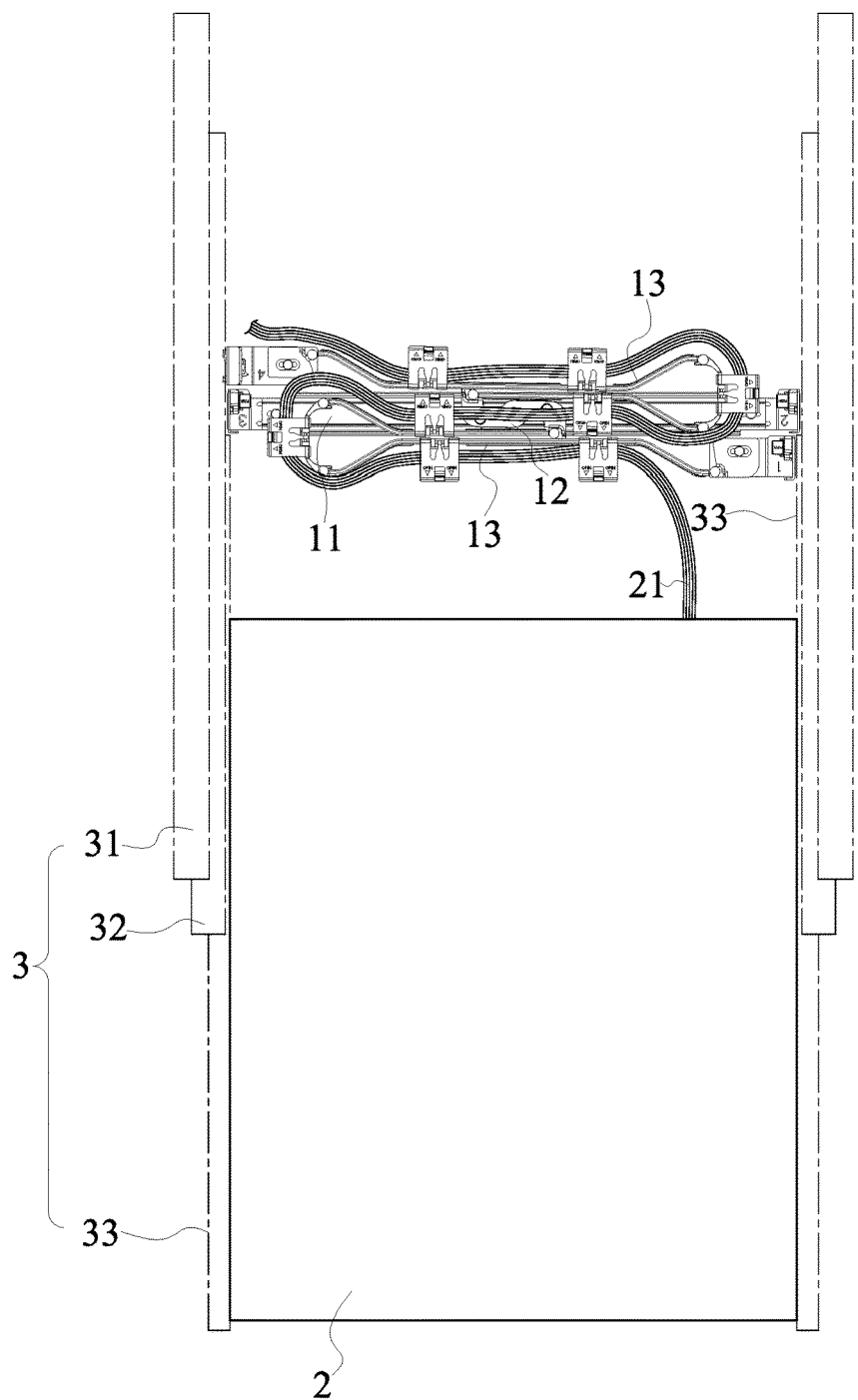
FIG. 4 is a schematic view of the operation of an extendable cable management frame being folded in accordance with a preferred embodiment of the present invention.

With reference to FIGS. 1 to 4 for the exploded view and perspective view of an extendable cable management frame and schematic views of different operating statuses of the extendable cable management frame in accordance with a preferred embodiment of the present invention respectively, the extendable cable management frame 1 is installed in a servo computer cabinet (not shown in the figure) and provided for connecting a computer host 2 between a pair of slide rails 3, wherein the slide rail 3 has two opposite outer rails 31, and the interior of each outer rail 31 sequentially includes a middle rail 32 and an inner rail 33, such that the inner rail 33 and the middle rail 32 can be extended in the same direction and folded into the outer rail 31, and the cable management frame 1 comprises a connecting frame 11, a pivot seat 12 and two cable management frames 13.

Both ends of the connecting frame 11 are coupled to the middle rails 32 on both sides and moved synchronously with the middle rails, and the center of the connecting frame 11 has a first pivot portion 111, and the center of the first pivot portion 111 has an arc limit hole 112.

The center of the bottom of the pivot seat 12 has a second pivot portion 121 configured to be corresponsive to the first pivot portion 111, so that the pivot seat 12 can be rotated with respect to the connecting frame 11, and the second pivot portion 121 has a limit portion 122 disposed around the periphery of the second pivot portion 121 and configured to be corresponsive to the arc limit hole 112, and a first connecting portion 123 disposed and separately and symmetrical on two sides of the top of the pivot seat 12. It is noteworthy that the arc limit hole 112 has a curvature corresponsive to the rotation angle of the pivot seat 12, and the rotation angle is not greater than 90 degrees. In addition, an elastic member 113 may be installed at the pivot seat 12 and between the connecting frames 11, so that the pivot seat 12 maintains its original position which is the position when the connecting frame 11 has not rotated. A predetermined distance is maintained between the bottom of the pivot seat 11 and the connecting frame 11, so that a friction effect is produced between the bottom of the pivot seat 12 and a surface of the connecting frame 11 to provide a positioning effect for folding and unfolding.

Each cable management frame 13 is formed by two sectional arms 131, a connecting plate 132 and a plurality of cable management boxes 133, and the connecting plate 132 is connected between the two sectional arms 131 and serves as a fulcrum when being folded, and the end portions of the arm 131 on the outer side of the two cable management frames 13 are coupled to an end of one of the outer rails 31 and the inner rail 33 respectively, and the end portion of the arm 131 disposed on the inner side of the two cable management frames 13 has a second connecting portion 1311 coupled to the two first connecting portions 123. When the computer host 2 is pulled outwardly, the two cable management frames 13 drive the pivot seat 12 to rotate in a direction towards along the arc limit hole 112, so that the two cable management frames 13 are unfolded along two opposite extending directions towards the rotating direction of the pivot seat 12. In the present invention, each arm 131 has a slide groove 1312 formed along the extending direction, and the backside of each cable management box 133 has a buckle portion 1331 movably installed to the arm 131, so that the cable management box 133 is limited to slide on the arm 131. Each cable management box 133 includes a main body 1332 and a cover 1333, and the main body 1332 has a cross-section substantially an U-shaped structure, and two opening end portions of the main body 1332 have a third pivot portion 13321 and a latch portion 13322 respectively, and the cover 1333 has a fourth pivot portion 13331 configured to be corresponsive to the third pivot portion 13321 and provided for pivotally coupling the cover 1333 to the main body 1332 for sealing the opening.

Wherein, the cover 1333 has two locking bumps 13332 formed at an edge of the cover 1333 and disposed opposite to the arm 131, and the locking bump 13332 and the arm 131 provide a latching and locking effect by mutual interference, and the locking bump 13332 is disposed at a 0-degree position which is the position when the cover 1333 is covered, and the other locking bump 13332 is disposed at a 90-degree position which is the position when the cover 1333 is opened, so that the cable management box 133 can be locked to the position opposite to the arm 131 when the cover 1333 is covered or opened. In addition, the connecting plate 132 is in a shape substantially similar to the arc shape of the outer contour of a light bulb, and the connecting plate 132 also has a slide groove 1321 for installing the at least one cable management box 133 and passing and accommodating the plurality of cables 21 of the computer host 2, so that the cables 21 can be bent according to the shape of the connecting plate 132.

What is claimed is:

1. An extendable cable management frame, installed in a servo computer cabinet, for connecting a computer host between a pair of slide rails, and the slide rail having two opposite outer rails, and an interior of each outer rail sequentially having a middle rail and an inner rail, such that the inner rail and the middle rail are extended in a same direction and folded into the outer rail, and the cable management frame comprising:

a connecting frame, with both ends coupled to and moved with the middle rails disposed on both sides respectively, and having a first pivot portion disposed at a center of the connecting frame, and a center of the first pivot portion having at least one arc limit hole;

a pivot seat, wherein a second pivot portion is disposed at a center of the pivot seat and configured to be corresponsive to the first pivot portion, so that the pivot seat may be rotated with respect to the connecting frame, a limit portion is disposed around a periphery of the second pivot portion and configured to be corresponsive to the arc limit hole, and a first connecting portion is disposed separately and symmetrically on both sides of a top of the pivot seat; and two cable management frames, each being formed by two sectional arms, a connecting plate and a plurality of cable management boxes, and the connecting plate being coupled between the two sectional arms and serving as a fulcrum when the two cable management frames are folded, and end portions of the arm disposed on an outer side of the two cable management frames being coupled to an end of the outer rails and the inner rail respectively, and the end portion of the arm disposed on the inner side of the two cable management frames having a second connecting portion coupled to the two first connecting portions; when the computer host is pulled outwardly, the two cable management frames drive the pivot seat to rotate in a direction along the arc limit hole, so that the two cable management frames are unfolded in two opposite extending directions.

2. The extendable cable management frame of claim 1, wherein each arm has a slide groove formed along an extending direction, and each cable management box has a buckle portion disposed on a backside of the cable management box and movably installed to the arm, so that the cable management box can be limited to slide on the arm, and each cable management box includes a main body and a cover, and the main body has a cross-section substantially an U-shaped structure, and two opening end portions of the main body are provided with a third pivot portion and a latch portion respectively, and the cover has a fourth pivot portion configured to be corresponsive to the third pivot portion and provided for pivotally coupling the cover to the main body to seal the opening.

3. The extendable cable management frame of claim 2, wherein the cover has at least one locking bump disposed at an edge of the cover and opposite to the arm, and the locking bump and the arm provide a latching and locking effect by mutual interference.

4. The extendable cable management frame of claim 3, wherein the cover has two locking bumps, and the locking bump is installed at a 0-degree position corresponding to a position when the cover is covered, and the other locking bump is disposed at a 90-degree position corresponding to a position when the cover is opened, so that when the cover is covered or opened, the cable management box is locked at the position opposite to the arm.

5. The extendable cable management frame of claim 1, wherein the connecting plate is in a shape substantially similar to an arc shape of an outer contour of a light bulb, and the connecting plate has a slide groove for installing the at least one cable management box and passing and accommodating the cables, so that the cables can be bent according to a shape of the connecting plate.

6. The extendable cable management frame of claim 1, wherein the arc limit hole has a curvature corresponding to a rotation angle of the pivot seat, and the rotation angle is not greater than 90 degrees.

7. The extendable cable management frame of claim 1, further comprising an elastic member installed to the pivot seat and between the connecting frames, so that the pivot seat maintains its original position when the connecting frame is not rotated.

* * * * *